(12) United States Patent
Blanchard et al.

(10) Patent No.: US 9,577,007 B2
(45) Date of Patent: Feb. 21, 2017

(54) ACTIVE LED MODULE WITH LED AND TRANSISTOR FORMED ON SAME SUBSTRATE

(71) Applicant: Nthdegree Technologies Worldwide Inc., Tempe, AZ (US)

(72) Inventors: Richard Austin Blanchard, Los Altos, CA (US); Bradley Steven Oraw, Chandler, AZ (US)

(73) Assignee: Nthdegree Technologies Worldwide Inc., Tempe, AZ (US)

( * ) Notice: Subject to any disclaimer, the term of this patent is extended or adjusted under 35 U.S.C. 154(b) by 0 days.

(21) Appl. No.: 14/868,082

(22) Filed: Sep. 28, 2015

(65) Prior Publication Data

US 2016/0020248 A1 Jan. 21, 2016

Related U.S. Application Data

(63) Continuation of application No. 14/204,965, filed on Mar. 11, 2014, now Pat. No. 9,177,992, which is a
(Continued)

(51) Int. Cl.
*H01L 27/15* (2006.01)
*H01L 33/32* (2010.01)

(52) U.S. Cl.
CPC ............ *H01L 27/153* (2013.01); *H01L 27/15* (2013.01); *H01L 33/32* (2013.01)

(58) Field of Classification Search
CPC ..................... H01L 27/15; H01L 2924/13062
See application file for complete search history.

(56) References Cited

U.S. PATENT DOCUMENTS

| 4,995,049 A | 2/1991 | Kahen et al. |
| 5,893,721 A | 4/1999 | Huang et al. |

(Continued)

FOREIGN PATENT DOCUMENTS

| DE | 19539033 A1 | 4/1996 |
| EP | 0514018 A2 | 11/1992 |

(Continued)

OTHER PUBLICATIONS

PCT/US2014/024758, "International Search Report and Written Opinion", dated Nov. 25, 2014, 21 pages.

*Primary Examiner* — Whitney T Moore
*Assistant Examiner* — Joseph Galvin, III
(74) *Attorney, Agent, or Firm* — Patent Law Group LLP; Brian D. Ogonowsky

(57) ABSTRACT

An LED module is disclosed containing an integrated driver transistor (e.g., a MOSFET) in series with an LED. In one embodiment, LED layers are grown over a substrate. The transistor regions are formed over the same substrate. After the LED layers, such as GaN layers, are grown to form the LED portion, a central area of the LED is etched away to expose a semiconductor surface in which the transistor regions are formed. A conductor connects the transistor in series with the LED. Another node of the transistor is electrically coupled to an electrode on the bottom surface of the substrate. In one embodiment, an anode of the LED is connected to one terminal of the module, one current carrying node of the transistor is connected to a second terminal of the module, and the control terminal of the transistor is connected to a third terminal of the module.

19 Claims, 8 Drawing Sheets

Related U.S. Application Data continuation-in-part of application No. 13/737,672, filed on Jan. 9, 2013, now Pat. No. 9,153,732.

(60) Provisional application No. 61/788,967, filed on Mar. 15, 2013.

(56) References Cited

U.S. PATENT DOCUMENTS

| | | | |
|---|---|---|---|
| 5,937,274 A * | 8/1999 | Kondow | B82Y 20/00 257/186 |
| 6,458,614 B1 | 10/2002 | Nanishi et al. | |
| 7,476,893 B2 | 1/2009 | Yang et al. | |
| 7,944,035 B2 | 5/2011 | Bol | |
| 7,977,133 B2 | 7/2011 | Yoo | |
| 2007/0200134 A1 | 8/2007 | Therrien et al. | |
| 2007/0284606 A1 | 12/2007 | Sugimori | |
| 2008/0258695 A1* | 10/2008 | Kumar | H05B 33/0818 323/223 |
| 2010/0140713 A1* | 6/2010 | Imoto | H01L 27/0277 257/355 |
| 2010/0317132 A1* | 12/2010 | Rogers | H01L 25/0753 438/27 |
| 2011/0248302 A1 | 10/2011 | Choi et al. | |
| 2012/0068207 A1 | 3/2012 | Hata et al. | |
| 2012/0086044 A1 | 4/2012 | Hata et al. | |
| 2012/0235800 A1* | 9/2012 | Hammerschmidt | H04B 3/546 340/12.22 |

FOREIGN PATENT DOCUMENTS

| | | | |
|---|---|---|---|
| EP | 2378555 A2 | 10/2011 | |
| GB | 2335792 A | 9/1999 | |
| JP | 2001127278 A | 5/2001 | |

\* cited by examiner

POSITIVE nCONTROL
pMOS

LED

NEGATIVE

POSITIVE nCONTROL
pnp

LED

NEGATIVE

POSITIVE

CONTROL
nMOS

LED

NEGATIVE

POSITIVE

CONTROL
npn

LED

NEGATIVE

POSITIVE

LED nCONTROL
pMOS

NEGATIVE

POSITIVE

LED nCONTROL
pnp

NEGATIVE

POSITIVE

LED

CONTROL
nMOS

NEGATIVE

POSITIVE

LED

CONTROL
npn

NEGATIVE

| T1 | T2 | T3 |
|---|---|---|
| NEGATIVE | POSITIVE | CONTROL |
| NEGATIVE | CONTROL | POSITIVE |
| POSITIVE | NEGATIVE | CONTROL |
| POSITIVE | CONTROL | NEGATIVE |
| CONTROL | POSITIVE | NEGATIVE |
| CONTROL | NEGATIVE | POSITIVE |
FIG. 10
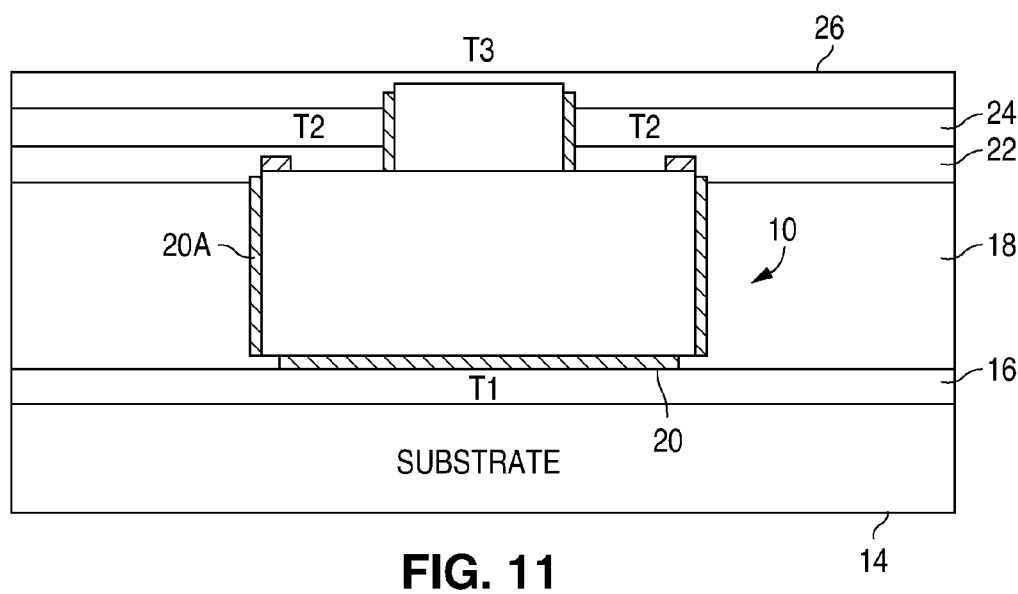
FIG. 11
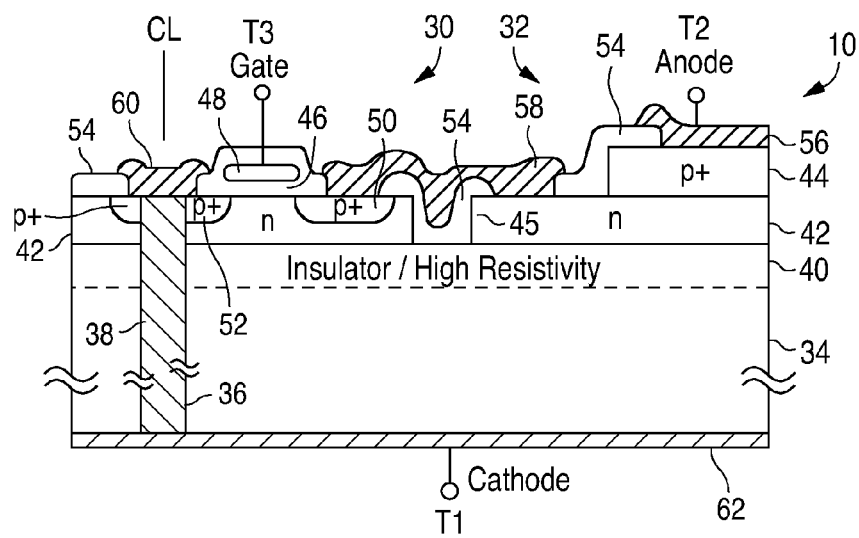
FIG. 12

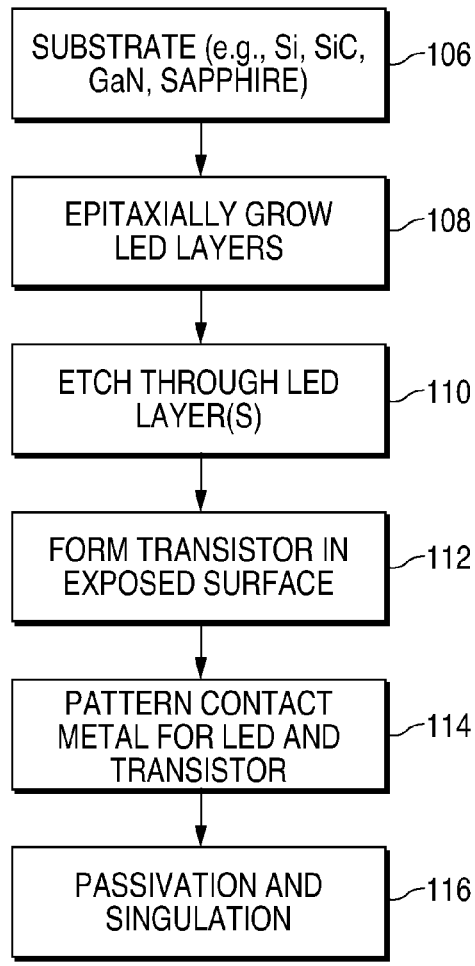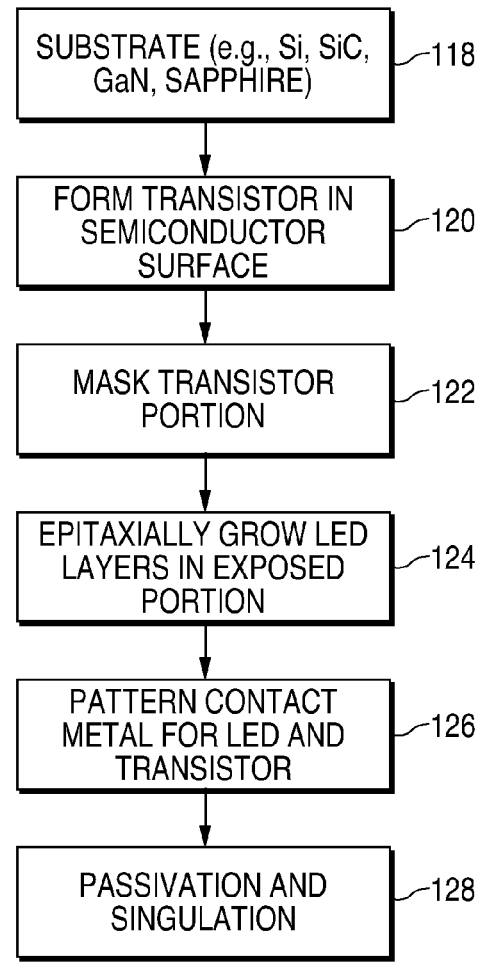
FIG. 22
FIG. 23

ACTIVE LED MODULE WITH LED AND TRANSISTOR FORMED ON SAME SUBSTRATE

CROSS-REFERENCE TO RELATED APPLICATIONS

This is a continuation of U.S. application Ser. No. 14/204,965, filed on Mar. 11, 2014, which is a continuation-in-part of application Ser. No. 13/737,672, filed on Jan. 9, 2013, and also claims priority to provisional application Ser. No. 61/788,967, filed on Mar. 15, 2013. All applications are assigned to the present assignee and incorporated herein by reference.

FIELD OF THE INVENTION

This invention relates to light emitting diodes (LEDs) and, in particular, to a single die containing driver circuitry in series with an LED to control current through the LED.

BACKGROUND

LEDs are typically formed as dies having an anode terminal and a cathode terminal. An LED die is typically mounted on a larger substrate for heat dissipation and packaging. The substrate may contain additional circuitry, such as a passive electrostatic discharge device. The LED die and optional substrate are then typically packaged, where the package has robust anode and cathode leads for being soldered to a printed circuit board (PCB).

LEDs may be controlled by a current source to achieve a desired brightness. The current source may be a MOSFET or a bipolar transistor formed in a separate die. The current source and LED are typically connected together by wires or a PCB.

Providing the current source separate from the LED die requires extra space and interconnections, adding cost. Other disadvantages exist, including the possibility of mismatching components. It would be desirable to provide a very compact LED module with an integrated current source driver circuit.

Additional problems arise when driving multi-colored LEDs, such as in a color display or for creating a white light source. An LED is a two terminal electrical device with non-linear voltage versus current characteristics. Below a particular voltage threshold, the LED is high impedance. Above the threshold, the LED's impedance is much lower. This threshold depends primarily on the bandgap of the semiconductor LED. The bandgap is selected for a particular peak emission wavelength. Red LEDs have bandgaps on the order of 2 eV, blue LEDs have bandgaps on the order of 3 eV, and green LEDs have bandgaps between 2 eV-3 eV. Since the forward voltage is directly related to the bandgap energy, red, green, and blue LEDs cannot simply be connected in parallel to output a desired color or light; each color LED must have its own driver circuit. The different materials (e.g., GaAs, GaN, etc.) used to form the different color LEDs also affect the forward voltages. Further, even within LEDs outputting the same wavelength, their forward voltages vary due to process variations, so even connecting the same color LEDs in parallel is problematic. Providing a separate driver circuit for each LED and interconnecting it to the LED adds space and cost. This added size is particularly undesired when trying to minimize the size of an RGB pixel in a display.

LEDs can be organized in passive matrix addressable arrays. For instance, a set of LEDs can be connected with their cathodes connected to a row select driver and their anodes connected to a column data bus. Several of these rows can be used to form a larger array addressable by row and column. Providing a controlled current through an addressed row-column will energize the LED(s) at the addressed location(s) to emit the desired color and intensity of light, such as for a color pixel in a display. Since the interconnection between the LEDs has a non-zero impedance, the voltage drop throughout the interconnect network can inadvertently forward bias a non-addressed set of LEDs. Such incidental forward bias will cause excess light in non-addressed segments, which reduces light-to-dark contrast of the array.

It would be desirable to create integrated LED modules that avoid the above-mentioned problems when connected in an addressable array.

It would also be desirable to create integrated LED modules where LEDs of different colors can be connected in parallel to form a high density of compact RGB pixels.

It would also be desirable to create integrated LED modules of different colors that can be inexpensively packaged together in a single panel for generating light for backlighting, for general illumination, or for a color display.

It would also be desirable to create an interconnection and addressing scheme for multiple LED modules to form a compact light or display panel.

SUMMARY

Problems related to parallel and addressable connections of LEDs, such as in a color display, can be resolved by using active LED modules. In one embodiment, a single vertical LED module includes an LED in series with a drive transistor (a voltage-to-current converter). Three terminals are provided on the module: a positive voltage terminal, a negative voltage terminal, and a control terminal for controlling the current through the LED. The difference between the voltages applied to the positive and negative voltage terminals must be sufficient to energize the LED to its full desired brightness when the control terminal is supplied a maximum value control signal.

The control terminal may be connected to the gate or source of a MOSFET connected in series with the LED. The control terminal is added so that the threshold non-linearity of the LED impedance is actively, rather than passively, controlled. For an LED module where voltage is provided across the power terminals of the module, the low impedance state (where the LED is emitting light) is determined by the control voltage applied to the control terminal. Such an active LED in a parallel or addressable network of LEDs would always be in a high impedance state until the control signal activates the low impedance state. This active impedance control reduces sensitivity to forward voltage and parasitic voltage drops and reverse current paths.

In one example, red, green, and blue LED modules are connected in parallel in an array for a multi-color display, where any set of RGB LEDs (forming a single pixel) is addressable by applying the same voltage across the voltage terminals of the three modules. The control terminal of each module is connected to a different variable control voltage to achieve the desired brightnesses of the red, green, and blue LEDs in the pixel. The control voltages are applied in sequence at 60 Hz or greater so that the different forward voltages of the RGB LEDs are no longer relevant.

In another embodiment, modules are connected in series and parallel for a white light source, where the white point is set by the relative combination of red, green, and blue light. The control voltage for each color and the duty cycle for each color are set to achieve the desired white point.

In other embodiments, various circuits are integrated with the LED to make the brightness of the LED less sensitive to variations in input voltage.

The modules are extremely compact since the footprint may be approximately the same as a single conventional LED die (e.g., 0.5 mm$^2$–1 mm$^2$). If the modules are printable, the footprint is much smaller.

In one embodiment, the LED layers and transistor layers/regions are formed on the same surface of the substrate. In one example, the bottom surface of the substrate is a cathode electrode. N-type and p-type layers are epitaxially grown over the substrate to form the LED. These LED layers may be GaN-based. The p-type layer for the LED is connected to an anode electrode. A center area of the LED layers is etched away, and a p-channel MOSFET (or other type of transistor) is formed in the exposed surface. The control terminal of the MOSFET is the third terminal of the module.

When the MOSFET is turned on, current flows vertically through the substrate, then laterally through the MOSFET, then vertically through the LED to turn on the LED. This one-side-processing technique may be used form transistors, such as MOSFETs or bipolar transistors, having either polarity.

Blue or green LEDs may be grown on a SiC layer or a GaN layer. An SiC substrate is conductive, so the substrate itself can conduct the vertical current. For a GaN layer grown on a sapphire substrate, the substrate is removed, such as by laser lift-off or grinding. Alternatively, a conductive via is formed through the sapphire substrate. In another embodiment, a silicon substrate is provided and intermediate layers are grown as buffer layers between the Si and the GaN layers to transition between the two lattice constants. If a silicon substrate is used, the LED is formed in the GaN layer, and the driver transistor is formed in the Si. Either device may be formed first. GaAs substrates may be used for forming red LEDs.

To avoid having to conduct current vertically through any of the possible substrates, a through-via in the substrate may be filled with a conductive material.

In one embodiment, the resulting LED modules are made very small and are screen printed on a display panel or printed using flexography. Printable modules may have a top surface area range of between, for example, 50-10,000 um$^2$. An array of small groups of the modules may be printed, where the modules in each group are connected in parallel to form a single color pixel having a desired maximum brightness. In one embodiment, the packaging for the module is also formed by printing.

In a large lighting system using hundreds of medium power LEDs, it would be impractical to provide a conventional drive circuit for each of the LEDs. For such white light sources, many LEDs are typically connected in series, and a high voltage is connected across the string. In the prior art, providing such a high voltage sometimes requires a step up regulator, adding cost to the system. The present invention inherently provides each LED with its own driver, allowing many LEDs, even of different colors, to be connected in parallel so that they may be driven with a low voltage (e.g., 5 volts). Providing each LED with its own driver also enables each LED to be controlled to output a desired brightness despite process variations, changes in brightness with temperature, and changes in brightness with age.

Various module embodiments are described along with various addressable arrays of LED modules that are suitable for LED displays or white light sources.

BRIEF DESCRIPTION OF DRAWINGS

FIG. 10 illustrates various ways to apply fixed voltages and variable control voltages to the three terminals of the module in FIG. 1, depending on the position of the LED and the type of driver transistor used.

FIG. 11 illustrates a singulated module die after packaging, such as in a panel, where conductor layers contact the three terminals of the module.

FIG. 12 is a cross-sectional view of one type of MOS transistor-LED configuration, where the structure may be symmetrical around a center line CL. In an actual device, the LED portion would be much wider than the transistor portion. The light may exit upward or downward.

FIG. 22 is a flowchart of process steps used to form an LED/driver module where the LED portion is formed before the transistor portion.

FIG. 23 is a flowchart of process steps used to form an LED/driver module where the transistor portion is formed before the LED portion.

Elements that are the same or similar in the figures are labeled with the same numeral.

DETAILED DESCRIPTION

Figure 1:
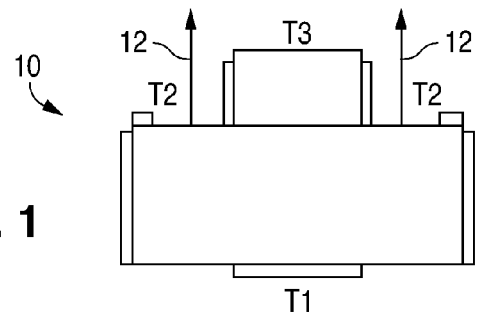
FIG. 1 is a simplified cross-sectional view of a single singulated LED/driver module in accordance with one embodiment of the invention.

FIG. 1 is a cross-sectional view of a singulated LED module 10. In one embodiment, the size (footprint) of the module 10 is about 0.05 mm$^2$-1 mm$^2$. If the modules 10 are to be printed as an ink, the sizes may be smaller. In the examples, the driver transistor is formed in the center area, and the LED is formed surrounding the transistor.

If the light is to exit the top surface, as light rays 12, the top terminals T2 are made small so as to block a minimum of light, and a reflector may be formed on the bottom surface of the substrate. If the substrate is opaque to the LED light, such as silicon, the light would exit the top surface, and no bottom reflector is needed. Depending on the application and the substrate, the light may even exit the bottom of the substrate.

As described below, the substrate may be any type of substrate that enables the growth of the LED epitaxial layers and enables the driver transistor portion to also be formed over/in the same substrate. In some examples, the LED is GaN-based and emits blue light or green light. The light may be converted by a phosphor layer. The LEDs may also be GaAs based and emit longer wavelengths, such as from green to red. The starting substrates may be Si, SiC, sapphire, GaN, or other suitable substrate.

Figure 6:
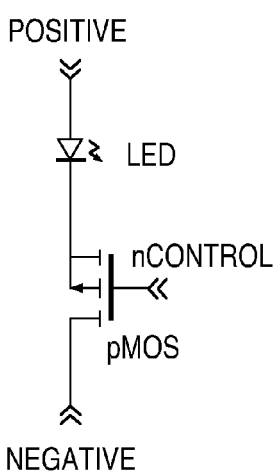
FIG. 6 illustrates a PMOS driver transistor connected to the cathode of an LED.

In one embodiment of the module 10, schematically shown in FIG. 6, a low-side PMOS transistor is the driver transistor. To control the module 10 of FIG. 1 to emit light, a positive voltage is applied to the terminal T2 (connected to the anode of the LED), a negative voltage is applied to the bottom terminal T1 (connected to the drain of the PMOS transistor), and a gate-source voltage exceeding the PMOS transistor's threshold (i.e., sufficiently more negative than the voltage applied to terminal T2) is applied to the terminal T3. The source is connected to the cathode of the LED internal to the module 10 to create a series connection between the driver transistor and the LED. In one embodiment, to forward bias the LED, the voltage differential across terminals T3 and T1 is greater than 2 volts. For a blue LED, the required voltage differential may be greater than 4 volts.

The driver transistor may be any type of transistor and may be a high-side transistor, a low-side transistor, a PMOS transistor, an NMOS transistor, an npn bipolar transistor, or a pnp bipolar transistor. FIGS. 2-9 illustrate various possible configurations and types of the driver transistor and the LED.

Figure 2:
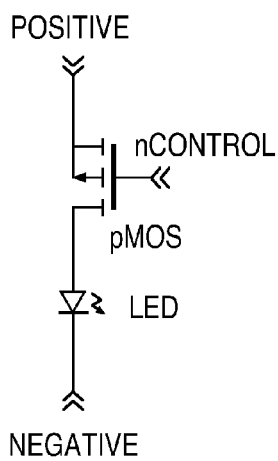
FIG. 2 illustrates a PMOS driver transistor connected to the anode of an LED.

FIG. 2 illustrates a PMOS driver transistor connected to the anode of an LED.

Figure 3:
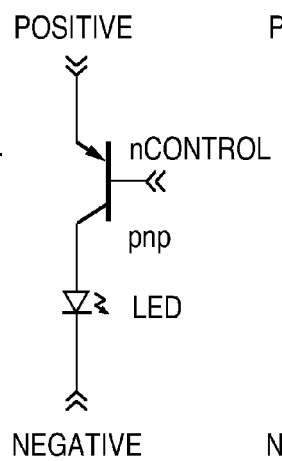
FIG. 3 illustrates a pnp bipolar driver transistor connected to the anode of an LED.

FIG. 3 illustrates a pnp bipolar driver transistor connected to the anode of an LED.

Figure 4:
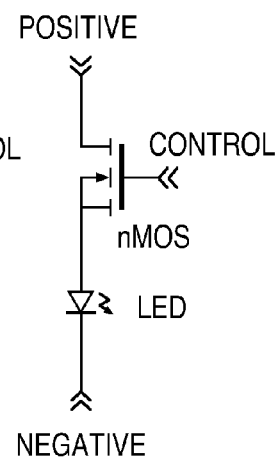
FIG. 4 illustrates an NMOS driver transistor connected to the anode of an LED.

FIG. 4 illustrates an NMOS driver transistor connected to the anode of an LED.

Figure 5:
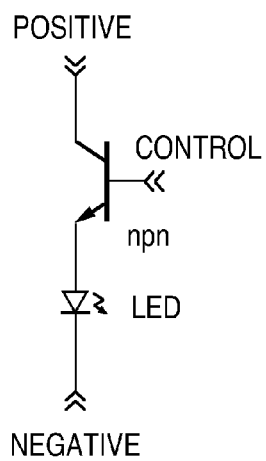
FIG. 5 illustrates an npn bipolar driver transistor connected to the anode of an LED.

FIG. 5 illustrates an npn bipolar driver transistor connected to the anode of an LED.

FIG. 6 illustrates a PMOS driver transistor connected to the cathode of an LED.

Figure 7:
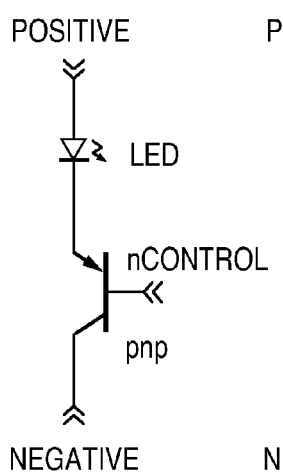
FIG. 7 illustrates a pnp bipolar driver transistor connected to the cathode of an LED.

FIG. 7 illustrates a pnp bipolar driver transistor connected to the cathode of an LED.

Figure 8:
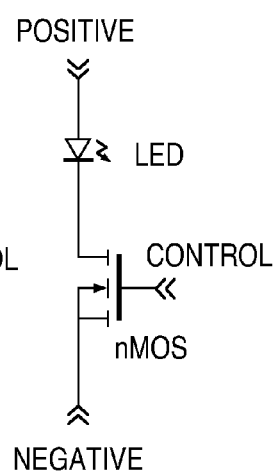
FIG. 8 illustrates an NMOS driver transistor connected to the cathode of an LED.

FIG. 8 illustrates an NMOS driver transistor connected to the cathode of an LED.

Figure 9:
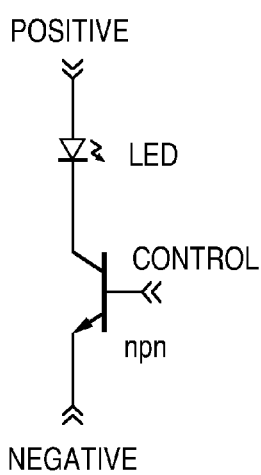
FIG. 9 illustrates an npn bipolar driver transistor connected to the cathode of an LED.

FIG. 9 illustrates an npn bipolar driver transistor connected to the cathode of an LED.

The transistors may also be HEMTs, MESFETs, or other types.

FIG. 10 identifies various ways to control an LED module, depending on the position of the LED and the type of transistor used. For example, instead of controlling a MOSFET by controlling its gate voltage, the gate voltage may be fixed (e.g., positive) and the source voltage may be controlled to achieve the desired Vgs.

FIG. 11 is a cross-sectional view of the module 10 packaged to encapsulate it and to provide conductors for applying power and control signals to the module 10. The encapsulated module 10 may form part of a display panel in which many modules are encapsulated in the same panel. In FIG. 11, a substrate 14 is provided, such as a transparent plastic or glass panel, with a conductor 16 for direct bonding to the terminal T1 of the LED module 10. In a panel, there may be many conductors 16 connected to various LED modules in an array, or a single conductor sheet may connect the LED modules in parallel. The metal conductor 16 is ultimately connected to a power terminal.

The modules 10 may be positioned by an automatic pick and place machine, or the modules 10 may be printed as an ink. If the modules 10 are printed as an ink, each module 10 may be microscopic (e.g., less than 200 microns across), and multiple modules for being controlled in the same way can be printed as a small group (e.g., a pixel), and the modules in the group are connected in parallel to generate the desired amount of light. The microscopic modules in each group will be generally randomly located in a small pixel area. The printing and patterning may be by flexographic printing, or screen printing, or other types of printing. When the ink is cured, such as by heating, the solvent evaporates, and the bottom terminals T1 of the modules 10 become ohmically connected to the underlying conductor 16. The shape of the modules 10 causes the modules 10 to be oriented correctly during printing.

Light from the LED may be emitted downward through the module 10 and substrate 14 or upward. If the light is to exit from the bottom of the substrate 14, the conductor 16 and substrate 14 would be transparent. If the light is to exit upward and the module 10 is transparent, the module 10 may include a reflective layer 20 as the terminal T1 electrode.

A dielectric layer 18 is then printed over the substrate 14 to encapsulate the sides of the module 10. The dielectric layer 18 may also encapsulate other modules supported by the substrate 14.

The module 10 may have a reflective film 20A formed on its sides prior to encapsulation to prevent side light emission, or the dielectric layer 18 may be reflective, such as white. Alternatively, side light from the LEDs is reflected upward and downward by the dielectric layer 18, such as where the dielectric layer 18 contains white titanium oxide particles. In such a case, the substrate 14 may be reflective so all light ultimately exits through the top surface of the panel.

A second conductor 22 is formed over the dielectric 18 to contact the terminal T2. The conductor 22 may be transparent if light is to exit the top surface. A dielectric layer 24 is formed over the conductor 22, and a third conductor 26 is formed over the dielectric layer 24 to contact the terminal T3. The conductor 26 may be transparent. In one embodiment, the conductors 16, 22, and 26 are narrow column and row lines of an addressable LED panel, such as a color display or a white light source. All the conductors may be printed.

A display panel may include many thousands of LED modules 10 of various colors, such as the primary colors red, green, and blue, or other colors, such as yellow and white. All LEDs may be blue LEDs, with the red and green colors being formed by red and green phosphors. If the panel is a white light panel to be used for general illumination or as a backlight for an LCD, each LED may be a blue LED coated with a phosphor that adds green and red components to form white light. The panel may be on the order of 2 mm thick and be any size. The various LEDs may be connected in any configuration, such as series, parallel, or a combination to achieve the desired voltage drop and current.

FIG. 12 illustrates a portion of the internal structure of a single module 10 having a center transistor portion 30 and an outer LED portion 32 formed over the top surface of the substrate 34. The structure may be symmetrical about the center line CL so the all portions of the LED surrounding the transistor are driven with an equal current. The circuit schematic of FIG. 12 is shown in FIG. 6, where a high-side LED is connected in series with a low-side PMOS transistor.

Figure 13:
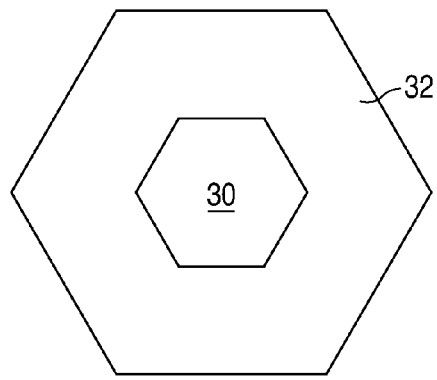
FIG. 13 is a top down view of a singulated hexagonal module, where the driver transistor is surrounded by the LED.
Figure 14:
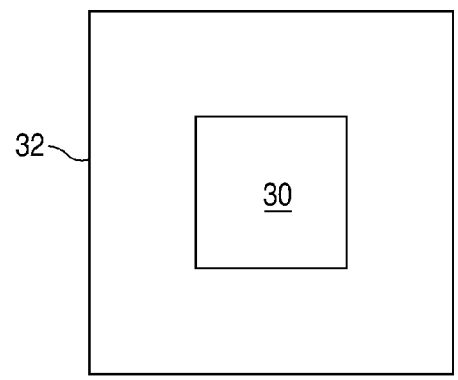
FIG. 14 is a top down view of a singulated rectangular module, where the driver transistor is surrounded by the LED.

As shown in FIGS. 13 and 14, the LED portion 32 may surround the transistor portion 30 to maximize the light generated. The modules 10 may be hexagonal or rectangular (including a square).

The gate terminal of the transistor is shown connected to terminal T3, the LED's anode is shown connected to terminal T2, and the bottom of the growth substrate 34 is connected to terminal T1. If the substrate 34 is not sufficiently conductive to conduct the vertical current, a through via 36 may be laser-drilled or etched and then filled with a conductive material 38. The walls of the via 36 may be first coated with a thin dielectric layer if needed. A wrap-around conductor may be used instead of a via to conduct the vertical current.

In one embodiment, the substrate 34 is silicon, GaN, SiC, GaAs or other suitable material. If a sapphire substrate is used as the growth substrate, for growing GaN layers, the sapphire may be removed by laser lift-off or grinding. Therefore, the substrate 34 will be the remaining GaN layers. If a silicon growth substrate is used, intermediate buffer layers are epitaxially grown over the silicon surface to provide lattice matching to the ultimate GaN layers in which the blue or green LED is formed. For red LEDs, the substrate 34 may be GaAs.

If the substrate 34 is conductive, an insulator layer or high resistivity layer 40 is grown or doped to effectively insulate the LED portion 32 from the transistor portion 30. The high resistivity layer 40 may be an undoped or counter-doped layer.

Over the high resistivity layer 40 is grown an n-type layer 42, such as a GaN-based layer. Various other layers (not shown) may be formed over the n-type layer 42 to form an active layer of a heterojunction LED, using conventional techniques. A p+ type layer 44 (also a GaN-based layer) is then formed to complete the LED layers.

Next, portions of the p+ type layer 44 and n-type layer 42 are etched using a conventional photolithographic masking and etching process to expose the central area of the n-type layer 42 and to form an isolation trench 45 around the transistor portion 30.

A thin gate dielectric layer 46 is formed, followed by depositing the gate layer, such as metal or polysilicon. The gate layer and dielectric layer 46 are then etched to form the gate 48.

Standard masking and dopant implantation techniques are then used to form the p+ type source region 50 and p+ type drain region 52 in the n-type layer 42 self-aligned to the gate 48.

A dielectric layer 54 is deposited and etched to expose the semiconductor areas that are to be contacted by a metal layer. The metal layer is then deposited and patterned to form the various metal contacts and connections. The metal portion 56 forms an anode contact for the LED, the metal portion 58 connects the source of the PMOS transistor to the cathode of the LED, and the metal portion 60 connects the drain of the PMOS transistor to the conductive material 38 in the via 36. The metal portion 58 may also short the p+ type region (source) to the n-type layer 42 (body region). A backside metal layer 62 connects to the conductive material 38 in the via 36. If the light is to exit through the bottom of the substrate 34, the backside conductor may be transparent or narrow traces of an opaque metal so as not to block a substantial amount of light.

Depending on the materials used, the transistor may be formed in Si, GaN, SiC, GaAs or other material.

Current flows vertically through the conductive material 38 in the via 36, laterally through the transistor, and vertically through the LED to turn on the LED. The light exits the top of the module 10. In an actual embodiment, the LED portion 32 may extend out more, and the anode metal portion 56 may only contact the edge of the LED so as not to block too much light. A transparent conductor or narrow metal lines may be deposited over the p+ type layer 44 to help spread current.

If the LED layers are GaN-based (hereinafter GaN), and if the substrate is not GaN, such as silicon, the transistor may be directly formed in the substrate (or a doped top layer) after etching away the LED GaN layers. FIGS. 22 and 23, described later, generally describe the differences in forming the module when the LED layers are formed prior to the formation of the transistor and when the LED layers are formed after the formation of the transistor.

FIGS. 15-21 illustrate other module designs.

Figure 15:
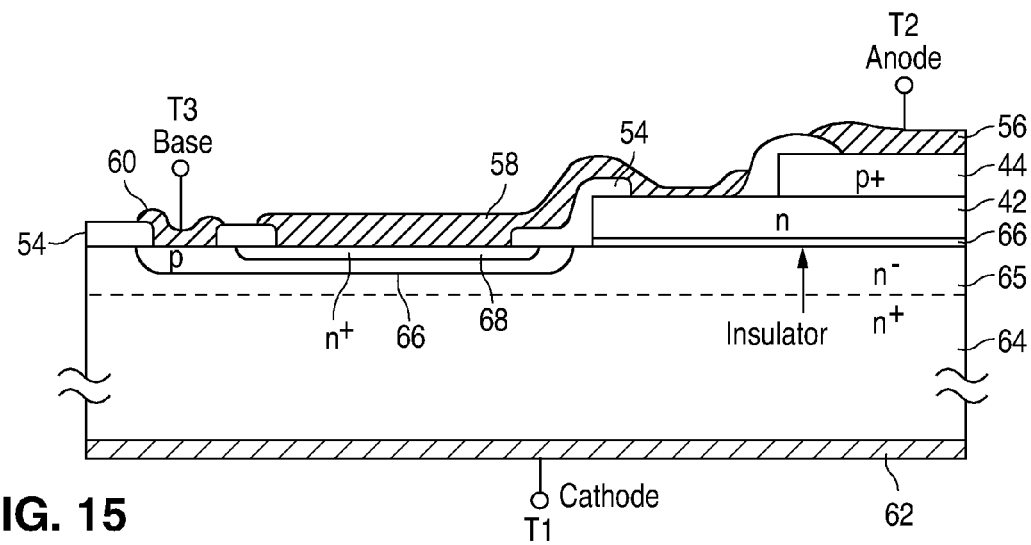
FIG. 15 is a cross-sectional view of one type of bipolar transistor-LED configuration, where the structure may be symmetrical around a center line.

FIG. 15 illustrates an LED/driver structure schematically illustrated in FIG. 9. An n+ type conductive substrate 64 has an n-type layer 65 grown over it or doped by implantation. An insulating layer 66 (e.g., an undoped layer or other high resistivity layer), is formed over the n-type layer 65, followed by growing the n-type and p+ type LED layers 42/44 (and any active layer). The LED layers and insulating layer 66 near the center of the module are then etched away, and the p-type base 66 and n+ type emitter 68 are implanted to form the npn bipolar transistor. The metal portions 56, 58, and 60 are deposited to form the interconnections and contacts leading to the terminals T2 and T3. The backside metal layer 62 forms the T1 terminal.

Figure 16:
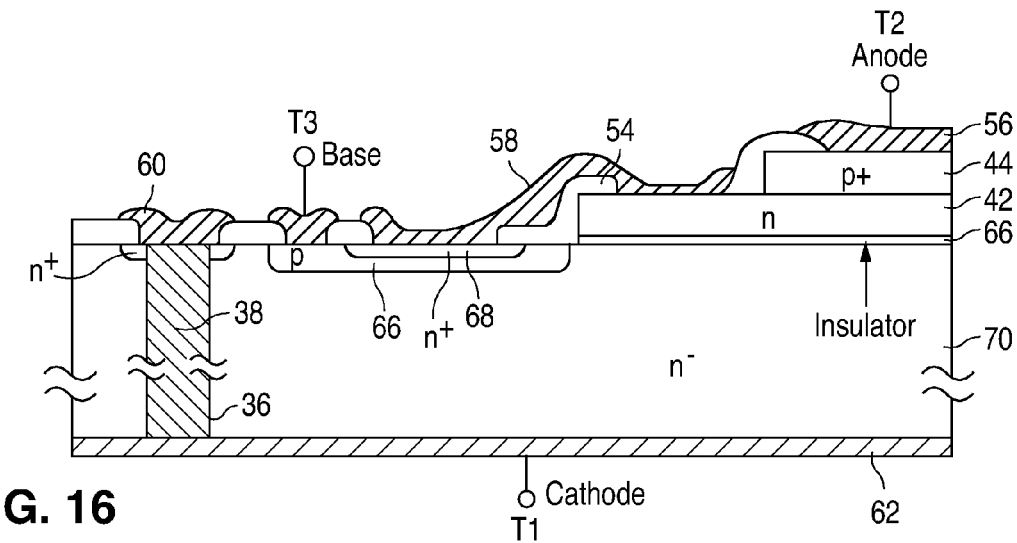
FIG. 16 is a cross-sectional view of another type of bipolar transistor-LED configuration, where the structure may be symmetrical around a center line.

FIG. 16 is similar to FIG. 15 but the substrate 70 is an n-type and not very conductive. So a via 36 filled with conductive material 38 connects the metal portion 60 (base contact) to the backside metal layer 62.

Figure 17:
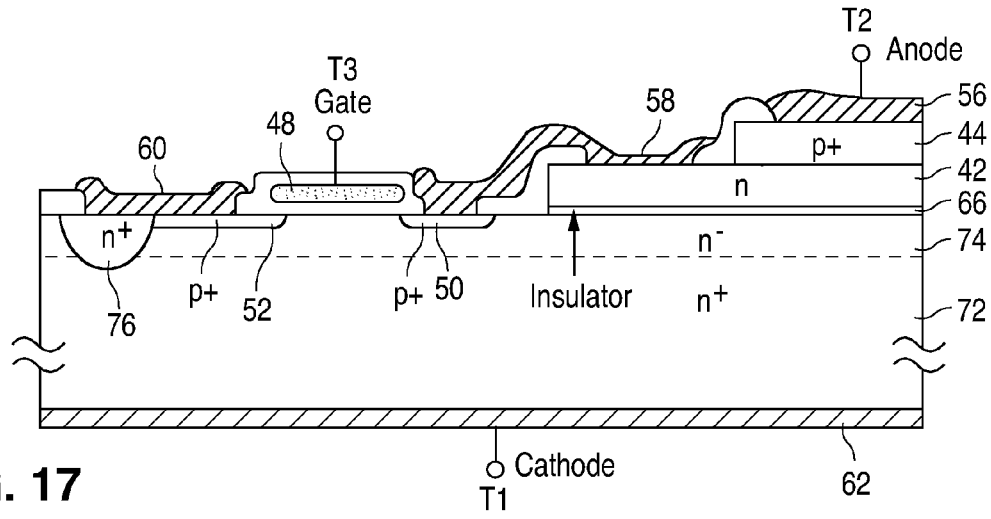
FIGS. 17-21 are cross-sectional views of other types of MOS transistor-LED configurations, where the structures may be symmetrical around a center line.

FIG. 17 is similar to FIG. 12 except the substrate 72 is a high conductivity n+ type, so no via is required for conducting the vertical current to the backside metal layer 62. Also, the transistor regions are formed in the substrate rather than in any n-type LED layer. The transistor's p+ type regions 50/52 are implanted in an n-type layer 74 grown over the n+ type substrate 72. An n+ type sinker 76 and the metal portion 60 electrically couple the drain current to the n+ type substrate 72.

Figure 18:
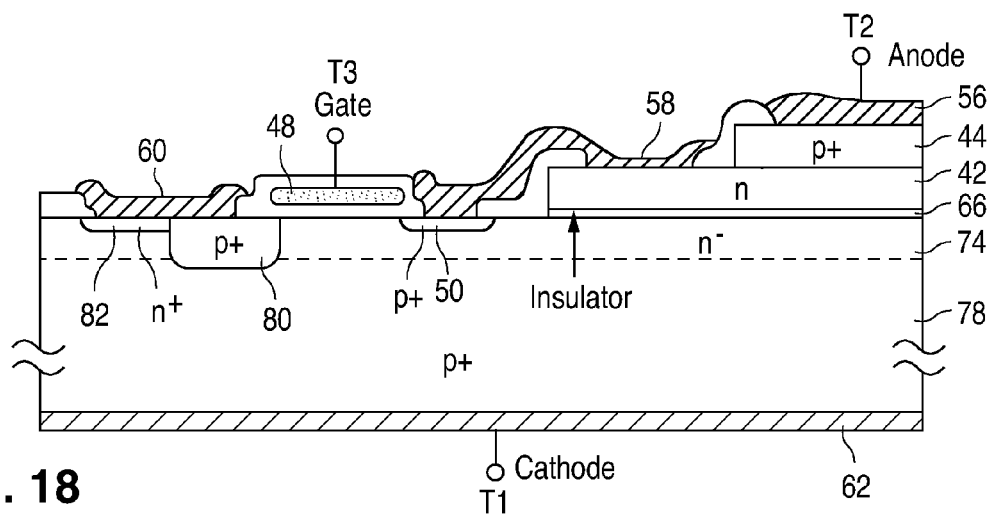

FIG. 18 is similar to FIG. 17 but uses a p+ type substrate 78. The transistor's p+ type regions 50 and 80 are formed in the n-type layer 74. The p+ type region 80 is deep to make contact to the p+ type substrate 78 to conduct the vertical current. An n+ type region 82 and the metal portion 60 short the p+ type region 80 to the n-type layer 74.

Figure 19:
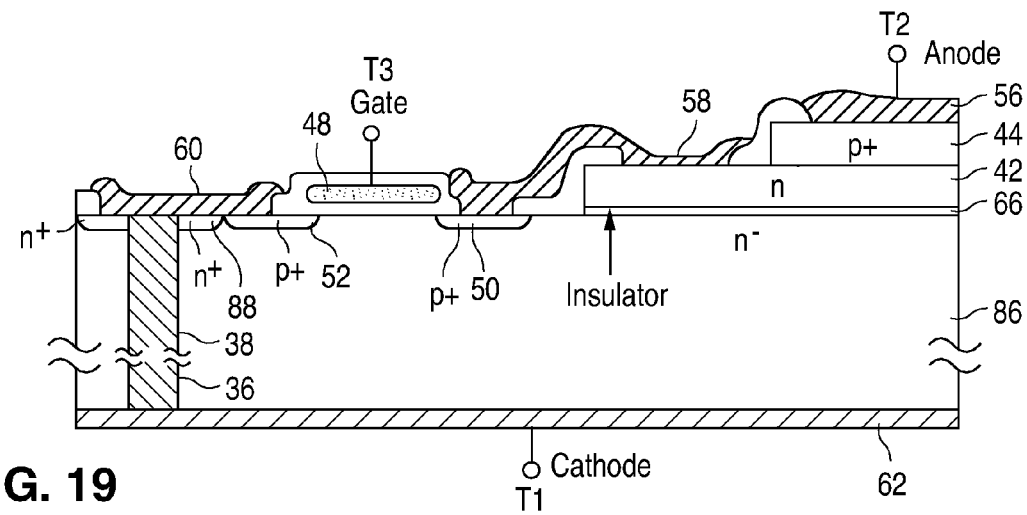

FIG. 19 is similar to FIG. 17 but the substrate 86 is an n-type, so the vertical current is conducted by the conductive material 38 in the via 36. The p+ type region 52 is shorted to the substrate 86 by the n+ type region 88 and the metal portion 60.

Figure 20:
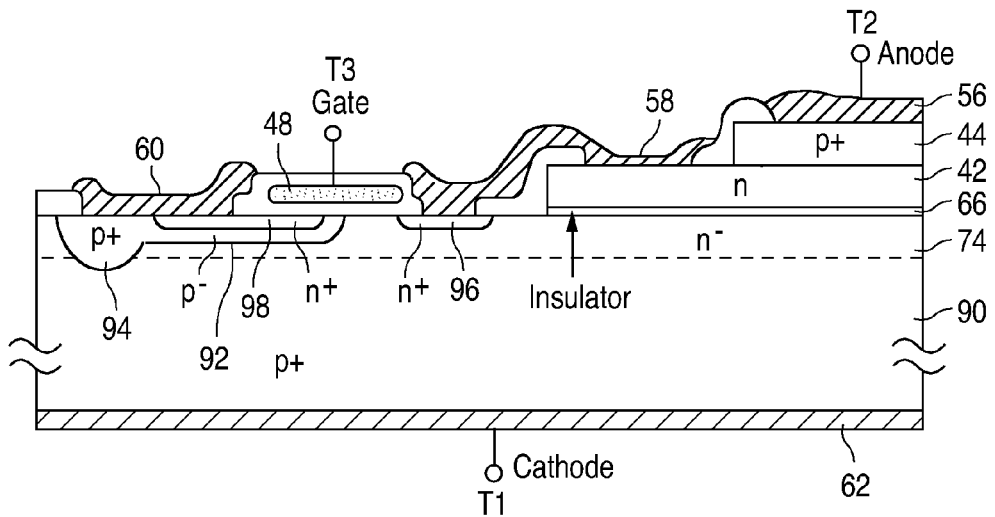

FIG. 20 illustrates the transistor as an n-channel DMOS transistor. The substrate 90 is p+ type, and an n-type layer 74 is grown over the substrate 90. The p-type body 92 is implanted in the n-type layer 74, and a deep p+ type region 94 connects the body 92 to the p+ type substrate 90. N+ type regions 96 and 98 are formed, where a sufficiently positive gate bias inverts the channel in the body 92 to conduct current laterally between the n+ type regions 96/98. The current is conducted vertically by the metal portion 60, the p+ type region 94, and the substrate 90. FIG. 8 best represents schematically the circuit of FIG. 20, where the NMOS transistor of FIG. 8 is the n-channel DMOS transistor in FIG. 20.

Figure 21:
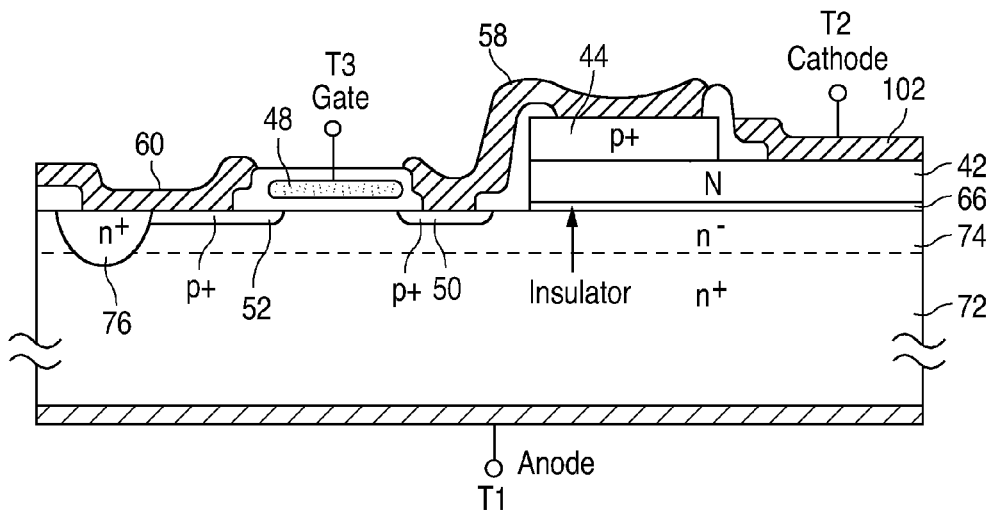

FIG. 21 is schematically illustrated by FIG. 2, where the LED is a low-side LED and the PMOS transistor is a high-side transistor. Some of the layers are similar to those in FIG. 17 and have been similarly numbered. The main differences are that the LED's cathode electrode 102 is connected to the terminal T2, and the metal portion 58 connects the p+ type region 50 (the drain of the PMOS transistor) to the p+ type layer 44 (anode) of the LED. Thus, the bottom of the n+ type substrate 72 serves as the anode of the module.

Many other related circuits can be fabricated to be equivalent to the various schematic circuits of FIGS. 2-9.

FIG. 22 is a flowchart of process steps used to form an LED/driver module where the LED portion is formed before the transistor portion.

In step 106, a starting substrate is provided. The substrate may be Si, SiC, GaN, GaAs, etc.

In step 108, assuming the LED is a blue LED, the LED's n-type, active, and p-type GaN-based layers are epitaxially grown over the substrate. Depending on the type of substrate, an insulator layer (e.g., undoped layer) may be grown as an intermediate layer between the substrate and the LED layers. The intermediate layers may also serve as lattice matching layers.

In step 110, one or more of the LED layers are etched to form the transistor area, such as in the center of the LED. Depending on the substrate material, the transistor may be formed in silicon, SiC, GaN, or GaAs. An FET transistor may be formed in any of those materials, including a JFET where a thin semiconductor region acts as the gate.

In step 112, the transistor's n and p-type regions are formed by implantation. The gate, if any, is also formed.

In step 114, the metal contacts to the various layers/regions are formed.

In step 116, the wafer on which the modules are fabricated is passivated and singulated to form the individual modules, such as the module 10 in FIG. 1. The modules may then be printed or placed on another substrate and packaged for connecting the package leads to the three terminals of the modules. The package may be an individual package or a package containing a plurality of the same or different modules. For example, a package may be a flat display panel containing modules emitting blue, green, and red light.

FIG. 23 is a flowchart of process steps used to form an LED/driver module where the transistor portion is formed before the LED portion.

In step 118, a starting substrate is provided, with or without any differently-doped top layer in which the transistor will be formed.

In step 120, assuming the transistor can be formed in the top surface of the substrate, the various transistor regions are formed along with any gate.

In step 122, the transistor area is masked. The LED portion may surround the transistor portion.

In step 124, the LED's GaN layers are epitaxially grown over the substrate in the exposed areas.

In step 126, the metal contacts to the various layers/regions are formed.

In step 128, the wafer on which the modules are fabricated is passivated and singulated to form the individual modules, such as module 10 in FIG. 1. The modules may then be printed or placed on another substrate and packaged for connecting the package leads to the three terminals of the modules.

By forming the driver transistor in the same substrate as the LED, there is no extra material cost for the driver and no significant real estate taken up by the driver. Therefore, the module may serve as a tiny single color pixel in a display. Since there is no distance between the LED and the driver, there is no parasitic capacitance that could delay the energization current to the LED. Therefore, the display pixels may be driven at a higher speed than conventional LED displays, where the driving current is provided remotely.

Figure 24:
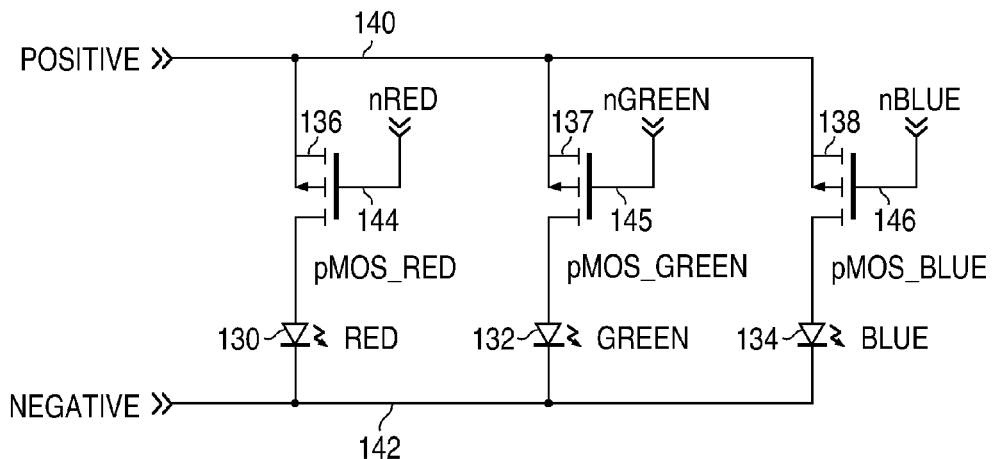
FIG. 24 illustrates RGB LED modules connected in parallel for a color display or for generating white light.

FIG. 24 illustrates circuitry in a single package containing at least three LED modules. The package may be a display panel containing an array of addressable LEDs. One module includes an LED 130 that emits red light, one module includes an LED 132 that emits green light, and one module includes an LED 134 that emits blue light. The LEDs 130 and 132 may be phosphor coated blue LEDs. The modules include p-channel MOSFETs 136, 137, and 138, similar to FIG. 2. The package includes conductors 140 (e.g., X-address lines) that electrically connect the sources together and conductors 142 (other X-address lines) that connect the LED's cathodes together so that the modules are connected in parallel. Each LED is controlled by a separate control voltage applied to the gate of its respective MOSFET by conductors 144-146 (e.g., Y-address lines). In this way, any color light, including white, may be generated by the package. The three modules may form a single color pixel in a display or may be part of a white light panel.

The advantage of the integrated modules, when controlling different color LEDs connected in parallel, is that the modules can have two common terminals connected to the positive and negative voltages, with the third terminal selecting a single LED at a time. By only turning on one color LED at a time, its forward voltage does not affect the voltage across the other LEDs. For example, if the control voltages were all pulled low concurrently, the low forward voltage of the red LED 130 would prevent the green and blue LEDs from turning on. As long as only one LED color is active at a time, then there is no conflict between different forward voltages. The turn-on duration of the different LED colors can be divided in time (time division multiplexing), and the control voltage level can be adjusted for the active LED forward voltage. In one embodiment, the control voltages applied to the gates of the MOSFETs 136-138 are provided sequentially at a frequency above about 60 Hz, where the relative duty cycles of the control voltages control the perceived color of light.

Figure 25:
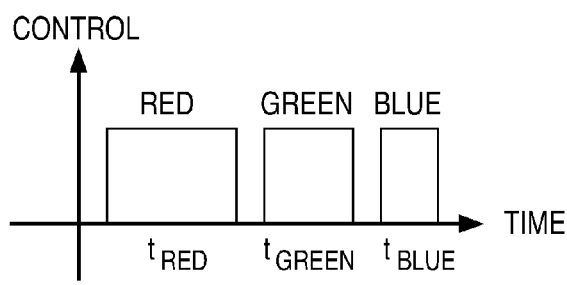
FIG. 25 illustrates how the RGB LEDs in FIG. 24 may be sequenced using the control voltage to create any color, including white light.

FIG. 25 is an example of the relative on-times of the red, green, and blue LEDs 130, 132, 134 in a single cycle for controlling the light emission from the three modules. The control voltages may be different for each color LED to cause the respective LED to emit a certain predetermined flux level (e.g., a nominal maximum brightness), whereby any overall brightness level and color, including white or neutral light, can be achieved by controlling the absolute on-times (for brightness) and the relative on-times (for color) per cycle.

Figure 26:
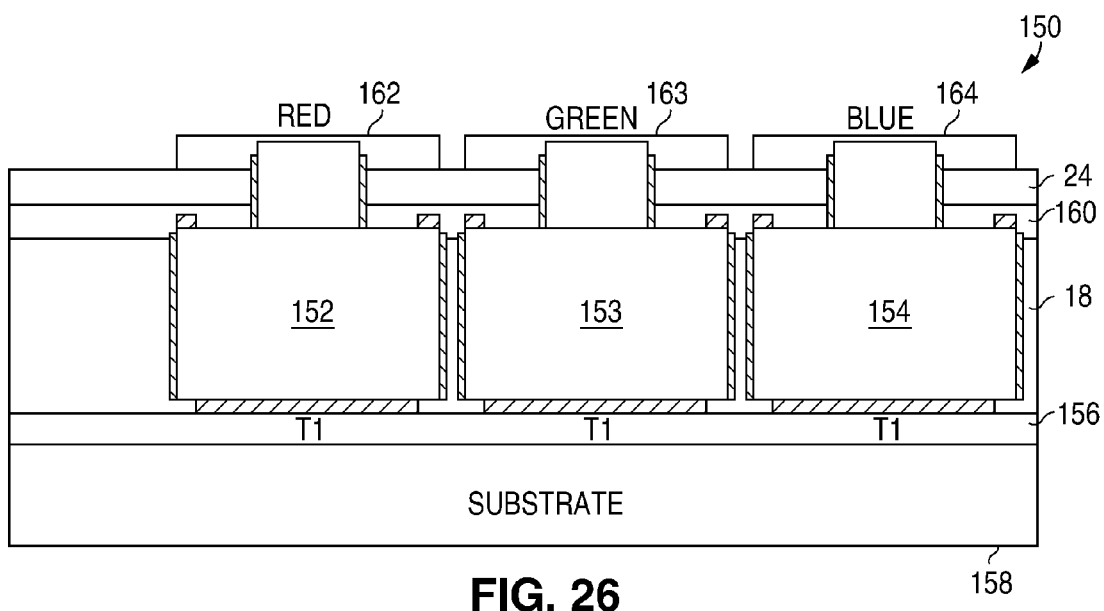
FIG. 26 illustrates separate RGB LED modules packaged together, such as in a color display.

FIG. 26 illustrates a package 150 containing three LED modules 152-154. The package may be an entire panel of addressable LEDs, and FIG. 26 may just illustrate a small portion of the panel. Module 152 contains a red LED, module 153 contains a green LED, and module 154 contains a blue LED. In the example of FIG. 26, the cathode terminals T1 of the LEDs are connected together by the conductor 156, supported by the substrate 158. The direction of light emission from the package 150 may be up or down. The various conductor layers may be opaque, reflective, or transparent, depending on which direction the light exits. The transistors in the modules 152-154 are p-channel MOSFETs, where a gate voltage sufficiently below the source voltage turns on the transistor and LED. The gates of the transistors are connected in common by the conductor 160, and the sources of the transistors are separately contacted by conductors 162-164, extending into and out of the drawing page. The voltage across the conductors 156 and 160 is higher than the forward voltage of any of the LEDs. By individually controlling the source voltages in a time-division fashion, the respective transistors can be separately controlled to conduct any current to control the mix of the RGB colors.

The dielectric layers 18 and 24 may be the same as in FIG. 11.

Alternatively, the sources of the transistors in FIG. 26 may be connected together by a conductor replacing conductors 162-164, and the gates are separately contacted by conductors replacing the common conductor 160 to allow individually controlling the transistors via the gate voltage.

In one embodiment, the structure of FIG. 26 represents a single 3-module package with five terminals. In another embodiment, the structure of FIG. 26 is only a portion of a much larger panel having a single substrate 158, where each color pixel location contains the three RGB modules. The dielectric 18 may be a single dielectric layer encapsulating all the modules on the panel. The pixels in a row may be addressed by applying a voltage across row (X) conductors 156 and 160, and the individual LEDs at any pixel location in an addressed row may be turned on by applying a suitable control voltage to the column (Y) conductors 162-164. Many modules in a column may receive the same control voltage, but LEDs in a non-addressed row will not turn on.

In high power (>0.1 W/in$^2$) lighting applications (including backlighting an LCD) where many LEDs can be on at the same time, it is advantageous, for a given power, to increase the operating voltage and reduce the current. Power losses in the printed interconnects are proportional to the square of the current; therefore efficiency can be increased by connecting multiple LED modules in series (such as modules in a single column), which sum to a larger voltage but lower current. Accordingly, the connectors between modules may connect modules in a combination of series and parallel.

If the panel of FIG. 26 is to be used for general lighting, there is no need for row addressing, and the columns of series red, green, and blue LEDs are just addressed in a rapid time division repeating pattern by applying control voltages to the control terminals. To the human eye, the colors blend together without flicker. Either the on-time per color, the particular number of LEDs in a series, or the control voltage per color may be selected to generate the desired perceived color (e.g., white point). The emitted color may be controlled to be selectable by the user.

For a lighting panel (as opposed to a color display with addressable pixels), convergence of the individual RGB elements is important to reduce visual nuisances of unmixed color. Therefore it is desirable to pattern the individual LEDs colors in a regular pattern that will converge into the desired color within a particular diffusion length. Secondly, for warm white colors, considerably more red power is needed than green and blue. An RGB array having a regular pattern and twice as many red LEDs as green and blue LEDs may be used.

Within a single module, diodes, resistors, and transistors may be formed. The base or gate of the transistor may be internally connected to a resistor to form a voltage or current limiter, or other circuit. Therefore, the modules may only need two operating voltage terminals and no control terminal. This may be suitable for general lighting purposes or backlighting purposes. The drivers are generally characterized as a voltage-to-current (V-to-I) driver.

Figure 27:
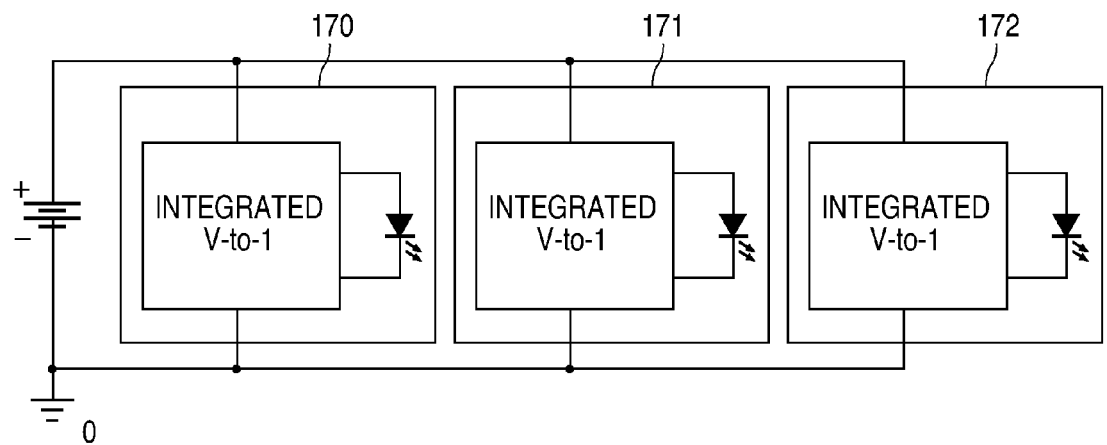
FIG. 27 illustrates how transistors and other circuitry may be integrated in the same substrate as the LED to form voltage clamps, current regulators, or other circuits. No external control voltage is required. This results in 2-terminal LED modules, such as RGB modules, where the modules are connected in parallel for a color pixel, including a white light pixel.

FIG. 27 illustrates 2-terminal modules 170, 171, and 172 connected in parallel, where the three modules 170-172 contain red, green, and blue LEDs to form a single light element in a light panel, such as for general illumination or backlighting. The circuitry is set for each color LED to emit the desired brightness (by setting a certain current through the LED) while also setting the desired voltage drop across the module to allow each of RGB LEDs to turn on. The integrated LED modules can be paralleled to achieve uniform luminance without other external components. In another embodiment, all the LED are the same color, including blue LEDs with a phosphor coating to generate white light.

The integration of the driver and LED into a single integrated circuit chip reduces intrinsic and parasitic uncertainty of the LED and the interconnection to the global system. The integration also greatly reduces the size and cost of the circuit compared to using non-integrated V-to-I drivers.

Additionally, providing each LED with its own controllable driver enables each LED to be controlled to output a desired brightness despite process variations, changes in brightness with temperature, and changes in brightness with age.

The preceding examples have mostly used MOSFETs and bipolar transistors; however, the scope of this invention is not limited by the transistor technology. Realizations can be created using a CMOS, BiCMOS, BCD, DMOS or other integrated circuit processes. Additional transistor technologies not shown could be used as well such as JFET, IGBT, Thyristor (SCR), Triac, and others.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A lighting device comprising:
a first growth layer having a top surface and a bottom surface;

a light emitting diode (LED) having at least a first LED layer of a first conductivity type and a second LED layer of a second conductivity type, the first LED layer and the second LED layer being epitaxially grown over the top surface of the first growth layer, wherein the LED is formed to have a central opening; and a first transistor formed over or in the top surface of the first growth layer, the first transistor comprising a first current carrying node, a second current carrying node, and a control node, wherein the first transistor is at least partially formed in the opening in the LED such that the LED surrounds the first transistor and emits light in an area surrounding the first transistor when the first transistor is turned on, wherein the first current carrying node is electrically coupled to the first LED layer with a metal layer formed over the first growth layer, and wherein the second current carrying node is electrically coupled to a bottom electrode formed on the bottom surface of the first growth layer, such that the first transistor is connected in series with the LED and the LED is turned on by a sufficient forward current flowing between the bottom electrode and the second LED layer when the first transistor is turned on.

2. The device of claim 1 wherein the first growth layer is a silicon substrate and the LED is GaN-based.

3. The device of claim 2 further comprising at least one buffer layer epitaxially grown over the silicon substrate to provide lattice matching between the substrate and the LED layers.

4. The device of claim 1 wherein the first transistor and the LED are both GaN-based.

5. The device of claim 4 wherein the first growth layer comprises a GaN-based layer that was epitaxially grown over a growth substrate, and wherein the growth substrate has been removed.

6. The device of claim 1 wherein the first growth layer is conductive.

7. The device of claim 1 further comprising a through-via formed through the first growth layer, wherein the through-via is at least partially filled with a conductive material to provide a vertical conductive path between the bottom electrode and the second current carrying node of the first transistor.

8. The device of claim 1 further comprising an insulating layer over the first growth layer, wherein the LED is formed over the insulating layer, to electrically insulate the second carrying node of the first transistor from the LED when the first transistor is in its off state.

9. The device of claim 8 further comprising the first LED layer grown over the insulating layer and a semiconductor layer of the first transistor also grown over the insulating layer.

10. The device of claim 8 further comprising the first LED layer grown over the insulating layer and a semiconductor region of the first transistor being a first doped region in the first growth layer.

11. The device of claim 10 wherein the first transistor is a bipolar transistor, wherein the first growth layer is a collector region, the first doped region is a base region, the first transistor further comprising a second doped region in the base region forming an emitter.

12. The device of claim 10 wherein the first transistor is an MOS transistor, wherein the first growth layer comprises a channel region, the first transistor further comprising a source region and a drain region on opposite sides of the channel region.

13. The device of claim 10 wherein the first transistor is a DMOS transistor, the first transistor further comprising a source region, a drain region, and a body region, wherein the source region, the drain region, and the body region are doped regions in the first growth layer.

14. The device of claim 8 wherein the insulating layer is a doped top surface of the first growth layer.

15. The device of claim 1 wherein the second LED layer is grown over the first LED layer.

16. The device of claim 15 wherein the first current carrying node of the first transistor is connected to the first LED layer by the metal layer.

17. The device of claim 15 wherein the first current carrying node of the first transistor is connected to the second LED layer by the metal layer.

18. The device of claim 1 wherein the first LED layer and the second LED layer are grown above the first growth layer, and doped regions of the first transistor are formed in the first growth layer.

19. The device of claim 1 wherein the first growth layer comprises a first portion of a first conductivity type below a second portion of a second conductivity type.

* * * * *